(12) United States Patent
Lin

(10) Patent No.: US 11,997,931 B2
(45) Date of Patent: May 28, 2024

(54) BAR-TYPE MAGNETORESISTIVE RANDOM ACCESS MEMORY CELL

(71) Applicant: TAIWAN SEMICONDUCTOR MANUFACTURING COMPANY LTD., Hsinchu (TW)

(72) Inventor: Shy-Jay Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 179 days.

(21) Appl. No.: 16/592,290

(22) Filed: Oct. 3, 2019

(65) Prior Publication Data

US 2020/0136019 A1 Apr. 30, 2020

Related U.S. Application Data

(60) Provisional application No. 62/753,315, filed on Oct. 31, 2018.

(51) Int. Cl.
*H10N 50/80* (2023.01)
*G11C 11/16* (2006.01)
(Continued)

(52) U.S. Cl.
CPC ........... *H10N 50/80* (2023.02); *G11C 11/161* (2013.01); *H10B 61/22* (2023.02); *H10N 50/01* (2023.02)

(58) Field of Classification Search
CPC ....... G11C 11/161; H01L 43/12; H01L 43/02; H01L 43/08; H01L 27/228; H10N 50/10; H10N 50/01; H10N 50/80; H10B 61/22
See application file for complete search history.

(56) References Cited

U.S. PATENT DOCUMENTS

| 6,166,948 A | 12/2000 | Parkin et al. |
| 2008/0164502 A1* | 7/2008 | Fukumoto ............. G11C 11/161 |
| | | 257/E27.005 |

(Continued)

FOREIGN PATENT DOCUMENTS

| CN | 101840993 | 9/2010 |
| CN | 102804438 | 11/2012 |

(Continued)

OTHER PUBLICATIONS

Office Action dated Dec. 21, 2020 for corresponding case No. KR 10-2019-0137929. (pp. 1-6).

(Continued)

*Primary Examiner* — Vongsavanh Sengdara
(74) *Attorney, Agent, or Firm* — Hauptman Ham, LLP

(57) ABSTRACT

A magnetoresistive random access memory (MRAM) cell includes a bar-type magnetic tunneling junction (MTJ), where the antiferromagnetic layer, the free layer, the barrier layer, and the reference layer have substantially aligned sidewalls. A spacer is against the sidewall of each of the antiferromagnetic layer, the free layer, the barrier layer, and the reference layer. A bar-type MTJ is manufactured from a single element of a pattern for isolated MTJs for MRAM cells. A barrier layer of a bar-type MTJ has a larger area than column-type MTJs, leading to extended MRAM cell lifetime because the barrier layer has a lower tunneling current density across the barrier layer.

20 Claims, 7 Drawing Sheets

(51) Int. Cl.
*H10B 61/00* (2023.01)
*H10N 50/01* (2023.01)

(56) References Cited

U.S. PATENT DOCUMENTS

| | | |
|---|---|---|
| 2010/0090300 A1 | 4/2010 | Xi et al. |
| 2010/0102404 A1* | 4/2010 | Li .................... H10N 50/01 257/E29.323 |
| 2010/0315863 A1 | 12/2010 | Zhu et al. |
| 2011/0284977 A1 | 11/2011 | Min et al. |
| 2012/0134199 A1* | 5/2012 | Zhu .................... H01F 10/329 365/158 |
| 2012/0205762 A1 | 8/2012 | Matsukawa et al. |
| 2015/1487168 | 9/2015 | Kalnitsky et al. |
| 2017/0092692 A1* | 3/2017 | Kalnitsky ............ H10N 50/10 |
| 2017/0194560 A1 | 7/2017 | Satake et al. |
| 2018/0005746 A1* | 1/2018 | Thomas ............... H01F 10/123 |
| 2018/0322994 A1* | 11/2018 | Rahman ............... G11C 11/161 |
| 2019/0074124 A1* | 3/2019 | Ishitani ................ H10N 50/10 |
| 2020/0043538 A1* | 2/2020 | Mihajlovic ........... H10N 52/00 |

FOREIGN PATENT DOCUMENTS

| | | |
|---|---|---|
| CN | 107546322 A | 1/2018 |
| DE | 60314129 | 1/2008 |
| DE | 102015117872 | 3/2017 |
| JP | 2005524238 A | 8/2005 |
| KR | 20080070812 | 7/2008 |
| KR | 20180002545 | 1/2018 |
| WO | 03/094182 | 11/2003 |
| WO | 03094182 A1 | 11/2003 |
| WO | 2007035786 | 3/2007 |

OTHER PUBLICATIONS

Office Action dated Aug. 23, 2021 for corresponding case No. KR 10-2019-0137929 (pp. 1-3).

Office Action dated Aug. 4, 2020 from corresponding application No. TW 108139332.

Office Action dated Dec. 16, 2021 for corresponding case No. CN 201911056904.5 (pp. 1-9).

* cited by examiner

BAR-TYPE MAGNETORESISTIVE RANDOM ACCESS MEMORY CELL

PRIORITY CLAIM

The present disclosure claims priority to, the provisional patent application No. 62/753,315 filed at the United States Patent and Trademark Office on Oct. 31, 2018, the entire disclosure of which is herein incorporated by reference.

BACKGROUND

Some integrated circuit manufacturing processes include manufacturing steps associated with making data storage circuit elements. Data storage elements such as dynamic random access memory (DRAM), static random access memory (SRAM), flash memory (a form of non-volatile memory), place data storage circuit elements in an integrated circuit in tightly-packed arrays of elements, to minimize the amount of die area occupied by data storage elements.

Magnetoresistive random access memory (MRAM) is a type of data storage element in which information is stored based on the orientation of a magnetic field in a circuit element. MRAM uses the magnetic field to store information rather than the presence/absence of electrical charge in a storage circuit element, or with the quantity of electronic charge stored in a data storage circuit element.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
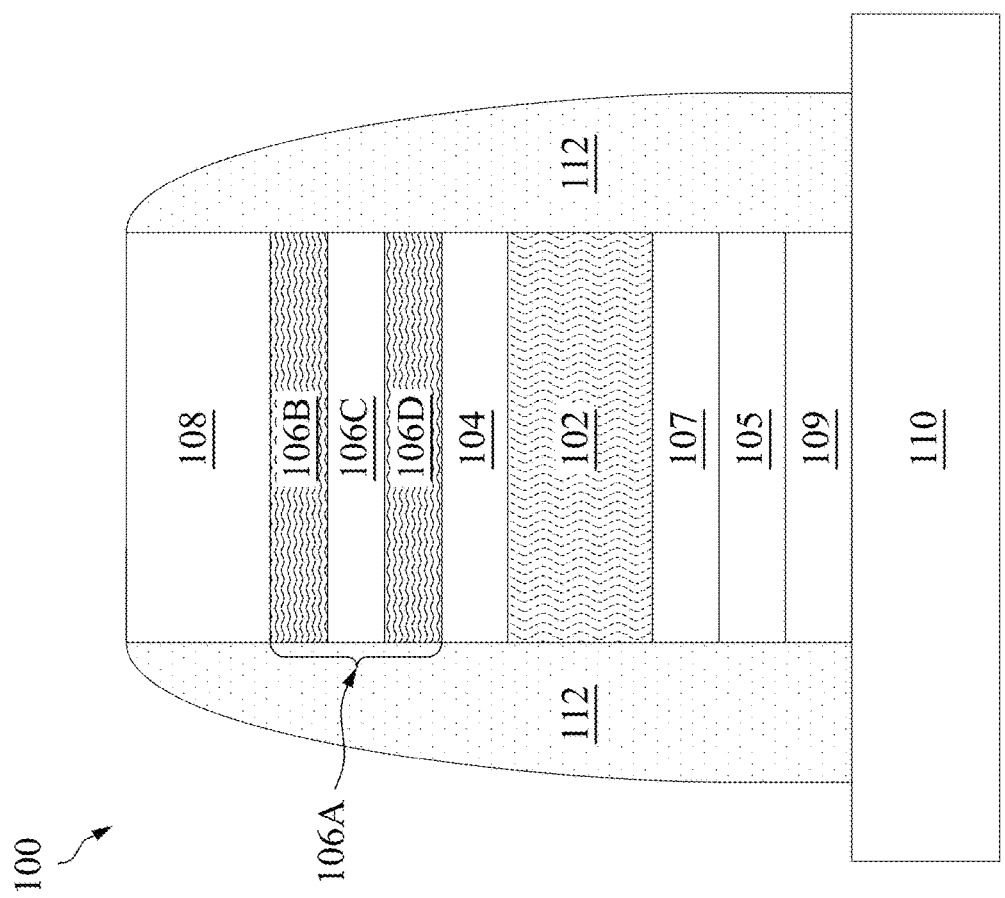
FIG. 1 is a cross-sectional view of a magnetic tunneling junction, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Magnetoresistive random access memory (MRAM) is a form of data storage element for integrated circuits. In comparison with other devices, MRAM uses small amounts of power to read and write data. MRAM also has long data retention times in comparison with other devices. In some embodiments, MRAM cells have multi-year data retention times, while the power consumption for reading and writing data is similar to single read or write operations for dynamic random access memory (DRAM) cells. However, in contrast to DRAM, MRAM is able to store data without regular refreshing of cells in order to preserve stored data.

MRAM cells include magnetic tunnel junctions (MTJs) that enable the use of tunneling magnetoresistance (TMR) to determine the information content of an MRAM cell. A magnetic tunnel junction includes a stack of at least three layers, including two ferromagnetic layers (a reference layer (also called a pinned layer), and a free layer), separated by a barrier layer. The reference layer has a layer of magnetizable material with a locked magnetic field orientation, and the free layer has a layer of magnetizable material where the magnetic field orientation changes between different orientations. When the magnetic field of the reference layer and the free layer are aligned having the same orientation, the MRAM cell allows a large amount of current to flow in comparison to the allowed amount of current flowing through the MRAM cell when the magnetic field of the reference layer and the magnetic field of the free layer have opposite orientations. The different amounts of current are associated with different information states (e.g., a high amount of current is associated with a "1" bit, and a low amount of current is associated a "0" bit, or vice versa) of the MRAM cell.

MRAM cells are of increasing interest in integrated circuit and semiconductor manufacturing because the magnetic fields of MRAM cells are able to provide long-term data storage. In some embodiments, the magnetization of the reference layer and/or the free layer of an MTJ in an MRAM cell retain the magnetic field orientations associated with a stored bit of information for up to several years, or longer, before thermally-induced field flipping occurs. The read time and the write time of an MRAM cell are fast (on the order of DRAM cell reading speed), but the data retention time is at orders of magnitude longer than data retention time a DRAM cell without refreshing.

A bar-type magnetic tunneling junction has a longer data retention lifetime as compared to a column-type or pillar-type magnetic tunneling junction because of the increased volume of the free layer. Thermal stability A of an MRAM cell is determined according to Equation (1), below:

$$\Delta = \frac{K_u V}{k_B T} \qquad \text{Equation (1)}$$

In an MRAM cell, $K_u$ is the magnetic anisotropy, which is proportional to the magnetization (m) and the anisotropy field ($H_k$) of the free layer and V is the free layer volume. As the anisotropy energy $K_u V$ increases, the magnetization of the material increases, which helps to prevent the magnetization of the material from flipping due to thermal perturbation (at a temperature T, $k_B T$ is the thermal fluctuation energy of the magnetizable material). The longer that thermally-perturbed magnetic flipping is prevented, the longer the stored information (in the magnetization of the magnetizable material) is retained. For example, a thermal stability of ~60 provides approximately a 10-year retention time of stored magnetic information. As the volume of the free layer increases, the thermal stability of the magnetic tunneling junction increases linearly. Thus, a doubling in the volume of the free layer corresponds to about a doubling of the thermal stability of the magnetic tunneling junction.

The lifetime of an MRAM cell is related to the quality of a barrier layer between the magnetizable materials in the reference layer and the free layer of an MTJ. When the barrier layer material beings to break down, the tunneling magnetoresistance of a MTJ decreases as traditional current flow replaces tunneling between the reference layer and pinned layer of the MTJ. Thus, preserving the quality of the barrier layer increases the lifetime of an MRAM cell.

In some embodiments, an MRAM cell is described having a bar-type magnetic tunnel junction, where the length and width of the magnetic tunnel junction are different lengths, with a larger free layer volume than is found in traditional pillar-type or column-type magnetic tunnel junctions where the length and width of the magnetic tunnel junction are the same, or nearly the same. In some embodiments, a bar-type MRAM cell includes a larger-area barrier layer than is found in pillar-type or column-type magnetic tunnel junctions. As the area of the barrier layer increases, the current density across the barrier layer decreases, increasing the reliability or lifetime of the bar-type MRAM cell, as opposed to a pillar-type or column-type magnetic tunnel junction. In some embodiments, an MRAM cell where the antiferromagnetic (or, heavy metal) layer of the MRAM cell has the same lateral dimensions in the layer of the integrated circuit as the reference layer, the free layer, and the barrier layer. That is, the sidewalls of the antiferromagnetic layer, the free layer, the barrier layer, and the reference layer are substantially aligned with each other because the sidewalls are defined in a single etch process.

Using a single etch process (e.g., to form a bar-shaped stack of the antiferromagnetic layer, the free layer, the barrier layer, and the reference layer) reduces the number of patterning masks used to manufacture the MRAM cell as compared to pillar-type or column-type MRAM cells. A manufacturing process for a bar-type MRAM cell uses the same patterning mask to isolate individual magnetic tunnel junction elements (e.g., reference layer, barrier layer, and free layer) in the layer of the integrated circuit and to direct the formation of individual antiferromagnetic layer (heavy metal layer) segments against the magnetic tunneling junction. In contrast, separate patterning masks are used for each of the antiferromagnetic layer and the reference layer, barrier layer, free layer stack segments in other approaches. For example, in pillar-type or column-type MRAM cells (see, e.g., FIG. 2), the magnetic tunneling junction (element 202) has a very small area with respect to the dimensions of the antiferromagnetic layer (element 208), and separate patterning masks are used to form each of the magnetic tunneling junction and the antiferromagnetic layer.

In some embodiments of MRAM cell manufacturing methods, a layer of dielectric material is deposited over the antiferromagnetic layer, reference layer, barrier layer, and free layer to form a spacer between the magnetic tunneling junction cell and other circuit elements, and to reduce the risk of heavy metal contamination of other portions of the integrated circuit during a manufacturing process. In some embodiments, the spacer is thinned over the top of the magnetic tunneling junction stack of the MRAM cell, but not completely removed. The remaining portion of dielectric material over the magnetic tunneling junction stack is sometimes used as an etch-stop layer. Such an etch-stop layer is usable during etching of openings for vias to the magnetic tunneling junction cell in a layer of inter-layer dielectric (ILD) material directly over the magnetic tunneling junction stack.

FIG. 1 is a cross-sectional view of a magnetic tunneling junction 100, in accordance with some embodiments. Magnetic tunneling junction 100 is a spin-orbit torque (SOT) magnetic tunneling junction. Magnetic tunneling junction includes a seed layer 109, an anti-pinning layer 107, a reference layer 102, a barrier layer 104, and a free layer 106A. Also shown are antiferromagnetic layer 108 and bit line 110, used for writing and reading information. Methods of making a reference layer, a barrier layer, and a free layer as described in FIG. 1 are further described in the discussion of FIG. 4 below.

Bit line 110 is located at the bottom of magnetic tunneling junction 100. A seed layer 109 has been deposited on a top surface of bit line 110. A seed layer is a layer of material that is used to modify the atomic spacing of the top-most surface on a substrate in preparation for deposition (e.g., by sputtering or electroplating) of a new material different from the material the seed layer is deposited on. A seed layer is also employed in stacks of materials, such as magnetic tunneling junction 100, in order to direct the atomic spacing and crystal orientation of the new material. Atomic spacing and crystal orientation are related to internal strain of materials, which impacts the electrical conductivity and magnetic properties of the deposited material.

Anti-pinning layer 107 is deposited over seed layer 109 in order to regulate the magnetic field of reference layer 102 and magnetic tunneling junction 100. Anti-pinning layer 107 is includes a ferromagnetic material. In some embodiments, anti-pinning layer 107 includes the same ferromagnetic material as reference layer 102, described below.

Reference layer 102 is a ferromagnetic material that is deposited over anti-pinning layer 107. Spacer layer 105 is deposited (by, e.g., chemical vapor deposition) onto the anti-pinning layer to physically separate anti-pinning layer 107 from reference layer 102. Spacer layer 105 is a dielectric material such as hafnium oxide (HfO), silicon dioxide ($SiO_2$), or another dielectric material suitable for use in an MRAM cell. Reference layer 102 is a ferromagnetic material or magnetizable layer that undergoes permanent magnetic field orientation during an integrated circuit manufacturing process. Setting a reference layer magnetic field orientation includes operations of heating the integrated circuit above the Curie temperature of the ferromagnetic material (or other magnetizable material) during the manufacturing process in order to erase any existing magnetic field orientation. After the ferromagnetic material has been heated to above the material's Curie temperature, the material is cooled to a temperature below the Curie temperature in the presence of an external magnetic field. When a magnetizable material cools below the Curie temperature, the material magnetization (magnetic field orientation) is set (e.g., the material assumes an unchanging magnetic field orientation) based on the orientation of the external magnetic field at the time the material cools to below the Curie temperatures. In some embodiments, the applied external magnetic field is perpendicular to the layer of magnetizable material. In some embodiments, the applied external magnetic field is parallel to the layer of magnetizable material. In some embodiments, a seed layer 109 is deposited on a bit line 110.

Magnetic tunneling junction 100 includes free layer 106A. Free layer 106A includes first free layer film 106B and second free layer film 106D. Coupling layer 106C separates first free layer film 106B and second free layer film 106D in order to promote the magnetization of the free layer during a MTJ write process in the MRAM cell. In some embodiments, free layer 106A includes a single layer of magnetizable material, with no coupling layer therein. In some embodiments, the free layer 106A and the reference layer 102 include the same magnetizable material. In some embodiments, the reference layer 102 and the free layer 106A include different magnetizable materials. In some embodiments, the free layer 106A includes magnetizable materials similar to those described hereinabove as used to make reference layer 102. In some embodiments, the first free layer film 106B and the second free layer film 106D include the same magnetizable material. In some embodiments, the first free layer film 106B and the second free layer film 106D include different magnetizable materials. In some embodiments, the first free layer film 106B and the second free layer film 106D independently include magnetizable materials similar to those described hereinabove as used to make reference layer 102.

Antiferromagnetic (AF) line 108 is positioned in proximity to the free layer 106A. When an electrical current flows through antiferromagnetic line 108, the metallic composition of antiferromagnetic line 108 produces a strong spin orbit torque effect, modifying the magnetic field orientation of free layer 106A (or, more specifically the first fee layer film 106B in free layer 106A) to write a bit of information to the magnetic tunneling junction 100.

Antiferromagnetic (AF) layer 108 is situated in the integrated circuit near to the free layer 106A of magnetic tunneling junction 100. Examples of antiferromagnetic materials used for antiferromagnetic layers in a magnetic tunneling junction are described below in the description of operation 402 of method 400.

Spacer 112 is a dielectric material against a top surface of bit line 108, the sidewalls of the reference layer 102, the barrier layer, 104, and the free layer 106A. In some embodiments, according to the shape and size of bit line 108, a spacer 112 is deposited on a dielectric material below magnetic tunneling junction 100 rather than a top surface of a bit line such as bit line 108. Spacer dielectric material is deposited onto the isolated magnetic tunneling junction and the antiferromagnetic layer, after the etch process to form the isolated magnetic tunneling junction is complete and has exposed the dielectric material below the seed layer 109 (or, at a level substantially consistent with the top of bit line 108). In some embodiments, spacer 112 is directly against all sidewalls of the magnetic tunneling junction. In some embodiments, spacer 112 is pulled down below the top of antiferromagnetic layer, leaving a portion of a sidewall of the antiferromagnetic layer exposed. In some embodiments, spacer 112 is pulled down below the bottom of the antiferromagnetic layer, exposing a portion of the magnetic tunneling junction sidewall (e.g., at least a portion of the free layer).

Figure 2:
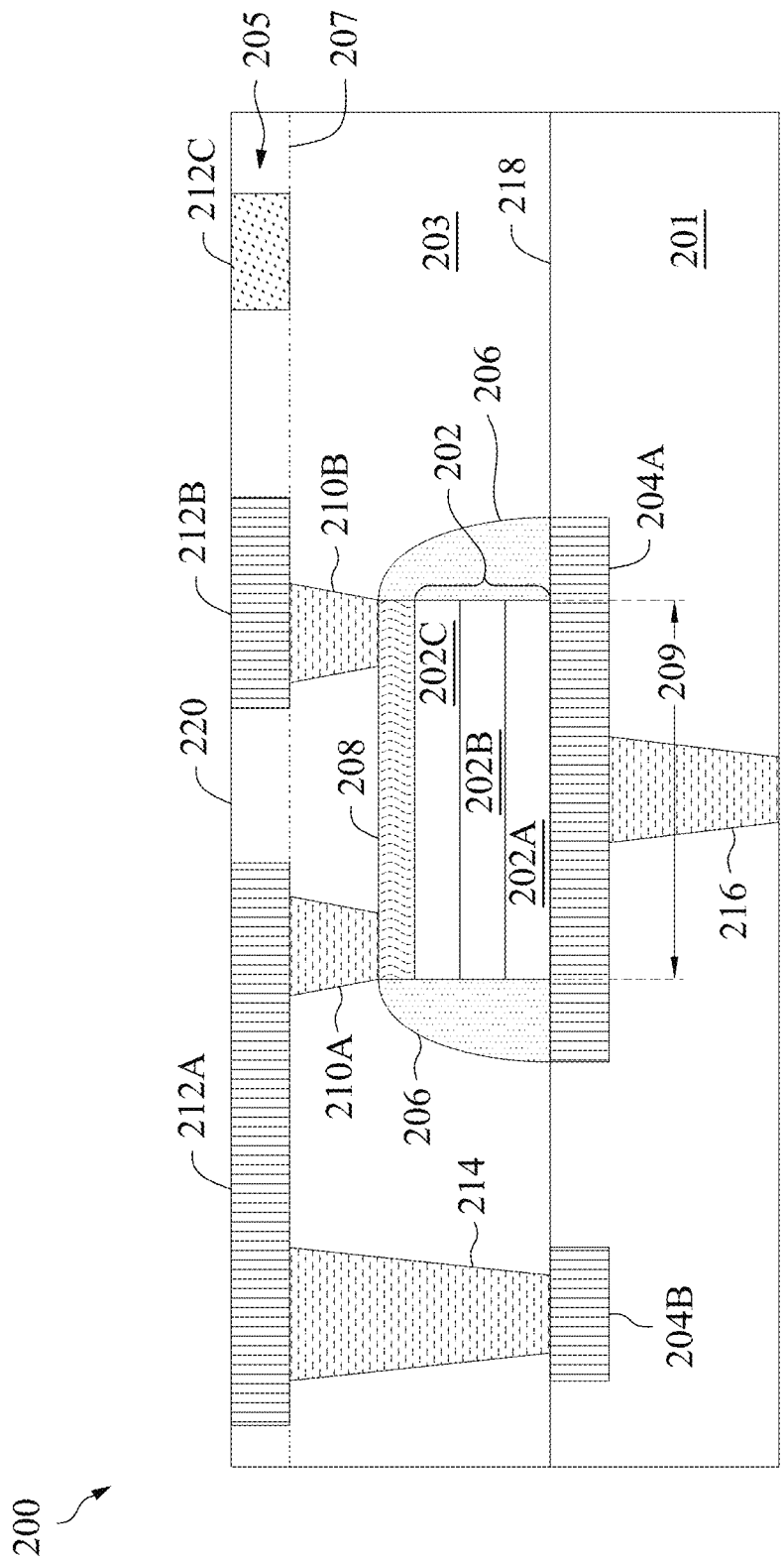
FIG. 2 is a cross-sectional diagram of an integrated circuit, in accordance with some embodiments.

FIG. 2 is a cross-sectional diagram of an integrated circuit 200 having a magnetic tunneling junction 202, in accordance with some embodiments. Magnetic tunneling junction 202 is a bar-type magnetic tunneling junction rather than a pillar-type shape found in other types MRAM cells. A pillar-type or column-type magnetic tunneling junction (see, e.g., FIG. 2, element 202) has a small pillar or column of tunneling junction films situated between a bit line and an antiferromagnetic layer of the MRAM cell. In some embodiments, a pillar-type or column-type magnetic tunneling junction has a width comparable to the width of the antiferromagnetic line, while the length of the antiferromagnetic line is considerably (e.g., at least 2 two times) larger than the length (or, width) of the magnetic tunneling junction pillar. In contrast, a bar-type magnetic tunneling junction includes a stack of tunneling junction films, as described in FIG. 1, where the width and length of the stack of tunneling junction films are the same as the width and length of the antiferromagnetic layer at the top of the magnetic tunneling junction. Further, a bar-type magnetic tunneling junction has a length (along a long axis of the antiferromagnetic line) that is considerably (e.g., at least 2 times) longer than the width of the antiferromagnetic line.

Magnetic tunneling junction 202 (more specifically, reference layer 202A) is directly against a conductive line 204A, and free layer 202C is directly against antiferromagnetic layer 208. Barrier layer 202B is between reference layer 202A and free layer 202C. Spacer 206 is against the sides of the each layer of magnetic tunneling junction 202 (e.g., layers 202A-C) and antiferromagnetic layer 208. In some embodiments, a magnetic tunneling junction has additional layers described in FIG. 1, such as a seed layer (see seed layer 109), a spacer layer (see spacer layer 105), and an anti-pinning layer (see anti-pinning layer 107).

In some embodiments, spacer 206 is a single layer spacer. In some embodiments, spacer 206 is a multi-layer spacer. In some embodiments, spacer 206 comprises at least one insulating material suitable for use in integrated circuit manufacturing, such as silicon nitride, silicon oxynitride, and so forth. In some embodiments, spacer 206 surrounds magnetic tunneling junction 202 and separates magnetic tunneling junction 202 from inter-layer dielectric (ILD) material 203. Integrated circuit 200 includes ILD 203 in a same layer as magnetic tunneling junction 202 and ILD 201 in a layer below ILD 203. In some embodiments, dielectric material 205 is against a top surface of ILD 203. In some embodiments, ILD 201 includes conductive line 204A, conductive line 204B, and via 216, which is electrically connected to conductive line 204A. Conductive line 204A is a bit line similar to bit line 110 of FIG. 1.

Conductive line 204A is a bit line configured to switch the magnetic field orientation of the magnetic field in a free layer of magnetic tunneling junction 202. In some embodiments, conductive line 204B is configured to connect to a drain side of a transistor (not shown) in the integrated circuit, configured to conduct a write-current for the magnetic tunneling junction 202. In some embodiment, an interface 218 corresponding to a top side of ILD 201, corresponds a top surface of conductive lines 204A and 204B, and an interface between magnetic tunneling junction 202 and conductive line 204A, or an interface between conductive line 204B and a via (or tall contact) 214 extending through ILD 203. Antiferromagnetic layer 208 is against a top surface of magnetic tunneling junction 202, and has a first length 209 corresponding to the first length 209 of the magnetic tunneling junction stack between the inner walls of spacer 206 on opposite sides of the magnetic tunneling junction 202. Vias (or, contacts) 210A and 210B are electrically connected to antiferromagnetic layer 208, and are configured to conduct an electrical current (a write current) through antiferromagnetic layer 208 during a magnetic tunneling junction write operation.

Via 214 extends from a top surface of conductive line 204B to a bottom surface of conductive line 212A. Via 210A extends from a top surface of antiferromagnetic layer 208 to a bottom surface of conductive line 212A. Via 210B extends from a top surface of antiferromagnetic layer 208 to a bottom surface of conductive line 212B. Conductive line 212C is a bit line associated with reading data stored in magnetic tunneling junctions of integrated circuit 200. In some embodiments, conductive lines 212A, 212B, and 212C are formed as part of a dual damascene process in a single layer of an ILD with via 214 and Vias 210A-B. In some embodiments, Vias 214, 210A and 210B are formed in ILD 203, and an ILD 205 is deposited on a top surface 207 of ILD 203 prior to formation of conductive lines 212A, 212B, and 212C in ILD 205. In some embodiments, the ILD is planarized using, e.g., a chemical mechanical polishing (CMP) tool in order to produce a top surface 220 of conductive lines 212A, 212B, 212C, and the ILD ready for deposition of additional ILD material for higher levels of the integrated circuit interconnection structure.

Information stored in magnetic tunneling junction 202 is written by passing an electrical current through antiferromagnetic layer 208. A write current triggers information storage by flowing between conductive lines 212A and 212B through via 210A, antiferromagnetic layer 208, and via 210B. Information stored in magnetic tunneling junction 202 is read by passing an electrical current across magnetic tunneling junction 202 between via 216 and one of via 210A or via 210B. Magnetic tunneling junction 202 is an example of a spin-orbit torque (SOT) MTJ in an MRAM cell.

Magnetic tunneling junction 202 and antiferromagnetic layer 208 have a length 209 between spacers 206 on the ends of the magnetic tunneling junction 202 and antiferromagnetic layer 208. Length 209 is measured in a manner similar to the measurement of length 307 in FIG. 3B. The layers of the magnetic tunneling junction have the same dimension as the antiferromagnetic layer 304 because the antiferromagnetic layer and the magnetic tunneling junction layers are formed using a same patterning mask for the etching of films in the film stack from which the magnetic tunneling junction is manufactured (see, e.g., patterned portion of patterning material 510 in FIG. 5A, below). The interface area between layers of the magnetic tunneling junction in the magnetic tunneling junction 202 is the same for each of the layers because the layers are formed using the same patterning mask.

Because the antiferromagnetic layer 304, the free layer 202C, the barrier layer 202B, and the reference layer 202A all have substantially similar lateral areas, and interface areas between layers, the barrier layer has a larger area than for pillar-type or column-type magnetic tunneling junctions (see, e.g., magnetic tunneling junction 202, FIG. 2, below). As the lateral dimensions of the barrier layer increases, the tunneling current density across the barrier layer during a read process decreases. Further description of barrier layer dimensions and tunneling current density follows for the discussion of FIG. 3B and FIG. 4. A decrease in tunneling current density across the barrier during a read process is associated with extended MRAM cell lifetime.

Figure 3A:
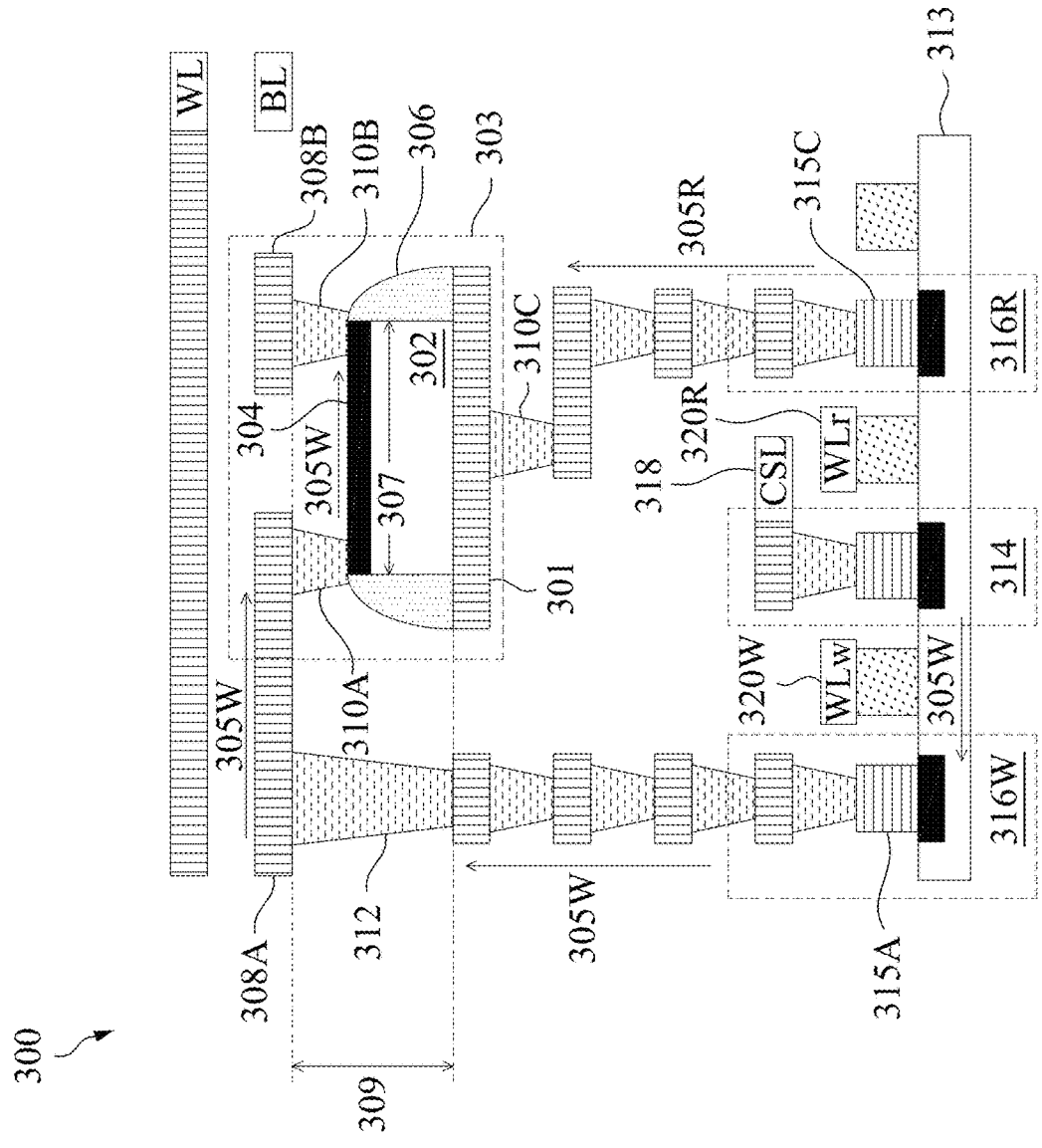
FIG. 3A is a cross-sectional diagram of an integrated circuit, in accordance with some embodiments.

FIG. 3A is a cross-sectional diagram of an integrated circuit 300, in accordance with some embodiments. Integrated circuit 300 includes a magnetic tunneling junction 302 with an antiferromagnetic layer 304 at a top end thereof as part of an MRAM cell 303. In MRAM cell 303, a first via 310A and a second via 310B are electrically connected to the antiferromagnetic layer 304, and magnetic tunneling junction 302 is electrically connected to a conductive line 301 situated below the magnetic tunneling junction 302 and the spacer 306 that surrounds sidewalls of the magnetic tunneling junction 302 and the sidewalls of the antiferromagnetic layer 304.

First via 310A is electrically connected to a conductive line 308A, and second via 310B is electrically connected to a conductive line 308B. First via 310A and second via 310B are short vias in comparison to via 312. Via 312 has a first height 309. First height 309 corresponds to the thickness of the short vias 310A and 3101B, plus the height (e.g., thickness) of the antiferromagnetic layer, and the height of the magnetic tunneling junction 302. Conductive lines 308A and 308B are, in some embodiments, in the same layer of an integrated circuit (e.g., in the same portion of dielectric material deposited subsequent to forming the MRAM cell 303) and formed as part of a dual damascene manufacturing process that forms via 312 and vias 310A-B. In some embodiments, conductive lines 308A and 308B are in a separate layer of dielectric material (e.g., in a second portion of dielectric material) deposited after formation of vias 312 and 310A-B.

Source line 318 is connected to source 314 over a substrate 313 in the integrated circuit 300. When a write process is being performed for MRAM cell 303, the word line 320W activates a write current 305W to pass through drain 316W, including poly line 315A, through a vertical stack of lines and vias up to via 312, and through conductive line 308A, via 310A, antiferromagnetic layer 304, via 3101B, and conductive line 308B.

When a read process is being performed for MRAM cell 303, the word line 320R activates a read current 305R to pass from source line 318 through source 314 and drain 316R, through a vertical stack of vias and conductive lines to via 310C, conductive line 301, through magnetic tunneling junction 302 (by tunneling), through via 310B, and into conductive line 308B.

Figure 3B:
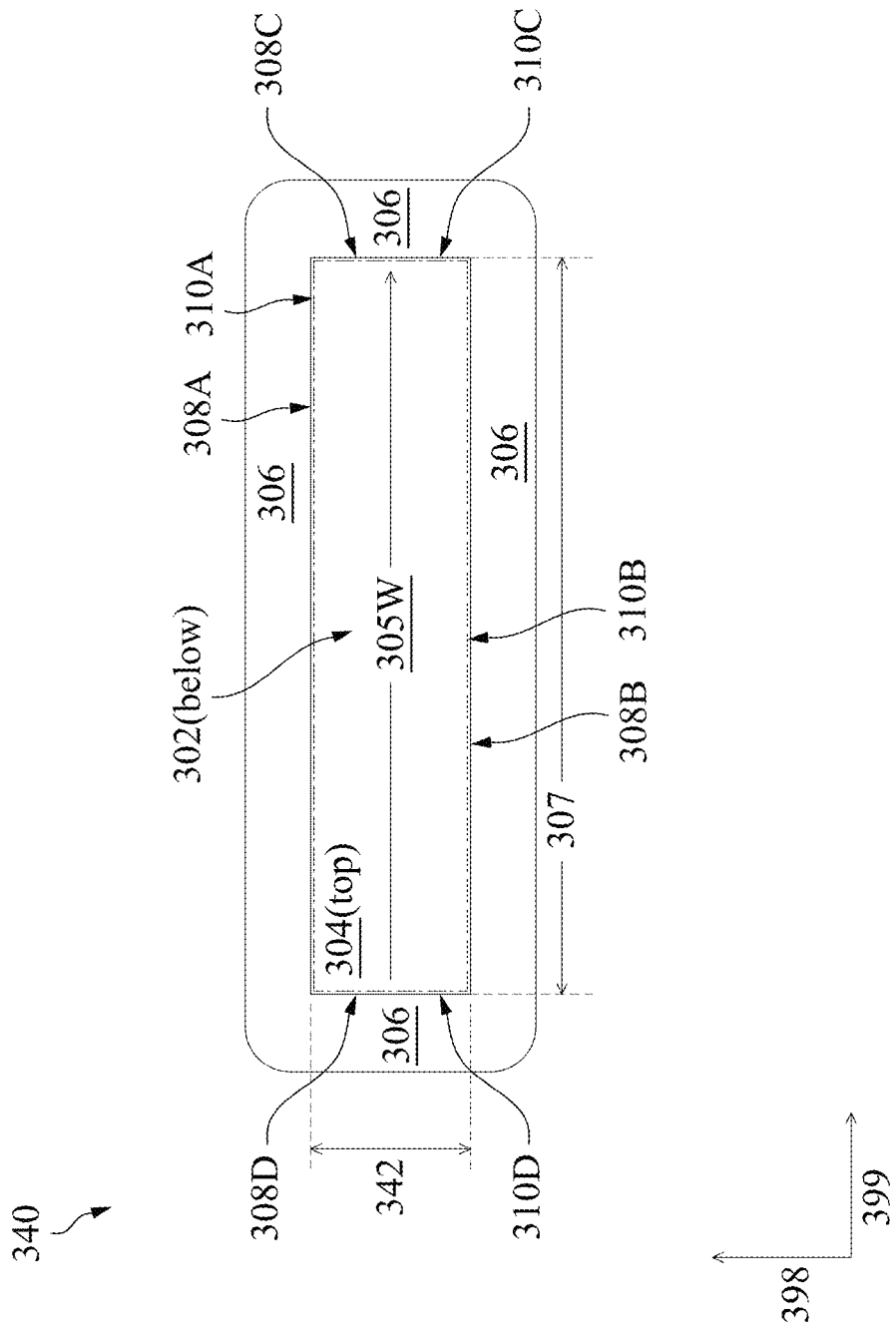
FIG. 3B is a top view of a bar of an MRAM cell, in accordance with some embodiments.

FIG. 3B is a top view of a bar 340 of an MRAM cell, in accordance with some embodiments. Bar-type magnetic tunneling junction 340 has spacer 306 surrounding an antiferromagnetic layer 304 on top of a magnetic tunneling junction 302. Magnetic tunneling junction 302 (the bar) has a junction length 307 and a junction width 342. Each layer of magnetic tunneling junction 302 has substantially the same junction length and junction width, also substantially similar to the antiferromagnetic layer length and the antiferromagnetic layer width. In some embodiments, the junction length is at least two times the junction width. In some embodiments, the junction length substantially the same as a distance between a source (see, source 314) and a drain (see, drain 316R) of the integrated circuit that supply a read current to the magnetic tunneling junction. In bar-type magnetic tunneling junctions, the antiferromagnetic layer width is substantially similar to the bar width, and the antiferromagnetic layer length is substantially similar to the bar length.

Magnetic tunneling junction 302 has a first magnetic tunneling junction sidewall (MTJ sidewall) 308A and a second MTJ sidewall 308B extending in a first direction 398, extending about from the first via 310A (see FIG. 3A) to the second via 310B (see FIG. 3A), where the first MTJ sidewall 308A and the second MTJ sidewall 308B are at opposite sides of the magnetic tunneling junction 302. Antiferromagnetic layer (AFL) 304 has a first antiferromagnetic layer sidewall 310A and a second AFL sidewall 310B at opposite sides of the antiferromagnetic layer 304. As is shown in FIG. 3B, the lateral positions (with respect to the spacer, in the first direction 398 and the second direction 399) of the first MTJ sidewall 308A and the first AFL sidewall 310A are approximately the same. Similarly, the lateral positions of the second MTJ sidewall 308B and the second AFL sidewall 310B are approximately the same. Magnetic tunneling junction 302 has a third MTJ sidewall 308C and a fourth MTJ sidewall 308D extending about in parallel along the second direction 399. Antiferromagnetic layer 304 has a third AFL sidewall 310C and a fourth AFL sidewall 310D extending about in parallel along the second direction 399.

Figure 4:
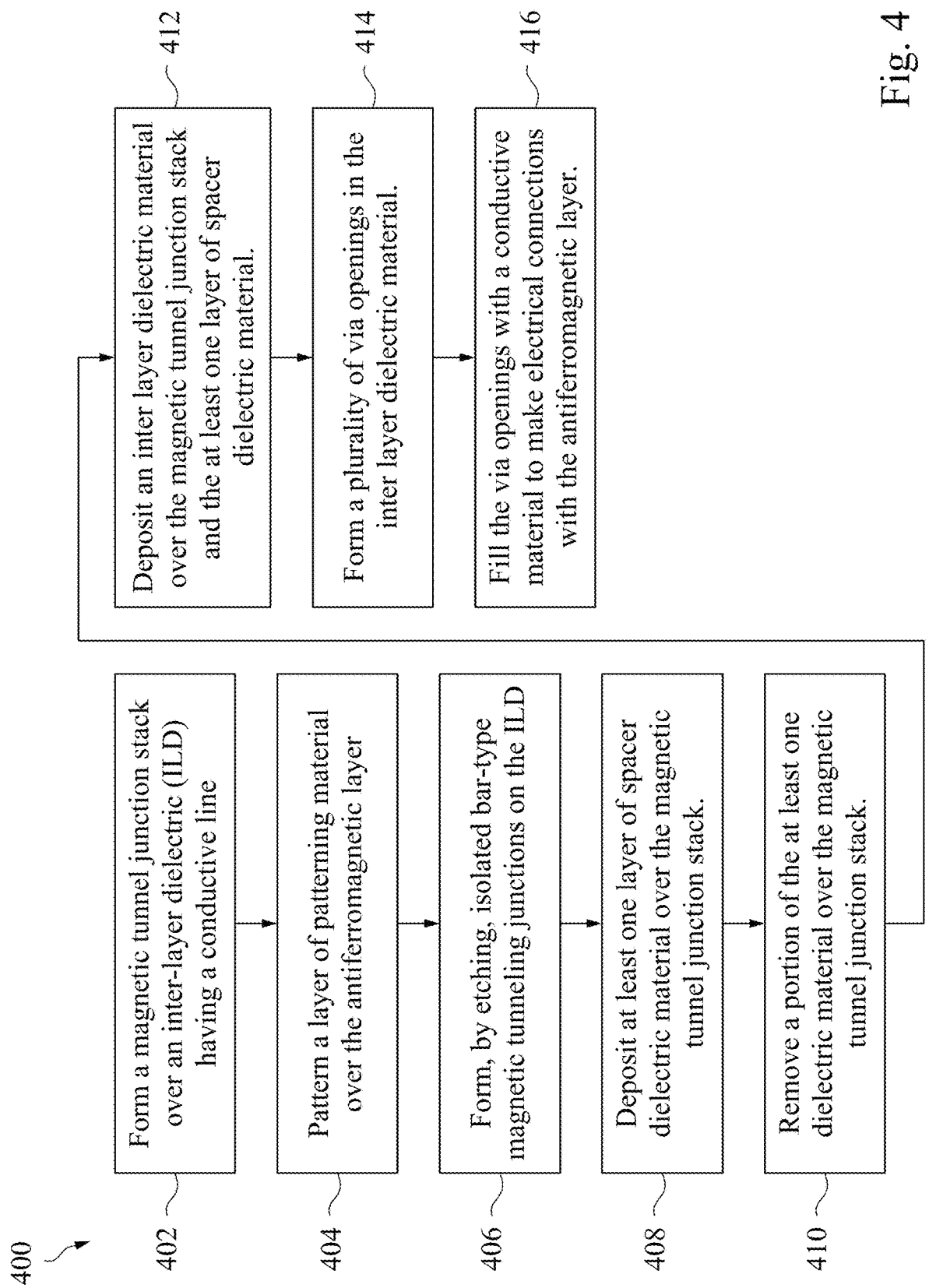
FIG. 4 is a flow diagram of a method of making an integrated circuit, in accordance with some embodiments.

FIG. 4 is a flow diagram of a method 400 of making an integrated circuit, in accordance with some embodiments. In an operation 402, a stack of films for making a magnetic tunneling junction stack is deposited on a base interlayer dielectric (ILD) material having a conductive line situated therein. The stack of films for making a magnetic tunneling junction stack includes a first ferromagnetic material to act as a reference layer, a layer of a barrier material (or, a barrier layer), and a second ferromagnetic material to act as a free layer. In some embodiments, the stack of films for making a magnetic tunneling junction stack further includes a seed layer to initiate growth of a ferromagnetic material on the conductive line in the base ILD material, and anti-pinning layers in the reference layer to modulate the magnetic field of the magnetic tunneling junction and to regulate tunneling current through the tunneling junction. In some embodiments, the free layer includes at least two layers of ferromagnetic material (a first free layer film and a second free layer film), with a coupling layer located between the first free layer film and the second free layer film. In some embodiments, the stack of films for making a magnetic tunneling junction includes a layer of antiferromagnetic material (an antiferromagnetic layer). In some embodiments, the free layer (whether a single ferromagnetic layer, or a first free layer film, a coupling layer, and a second free layer film, as described above) is between the barrier layer and the antiferromagnetic layer.

A seed layer (not shown) is deposited on the base ILD having a conductive line therein in order to promote the ordered growth of ferromagnetic material for the magnetic tunneling junction. The conductive line in the base ILD serves as an electrode for the magnetic tunneling junction. For example, conductive line 301 in FIG. 3A; conductive lines 204A and 204B in FIG. 2; or vias 310A-B in FIG. 3A act as electrodes. In some embodiments, the seed layer is a pure metal, or an alloy of metals. In some embodiments, the seed layer includes chromium (Cr), titanium (Ti), or alloys thereof (e.g., $Cr_xTi_y$, where x+y=1).

In some embodiments, an anti-pinning layer (not shown) is deposited on a seed layer before a reference layer is formed in the magnetic tunneling junction stack. An anti-pinning layer includes a ferromagnetic material with a magnetic field oriented to promote and/or modulate the flow of current across the barrier layer in the magnetic tunneling junction. The magnetic field orientation of the anti-pinning layer is set during a manufacturing process. In some embodiments, the magnetic field orientation of the anti-pinning layer is in a same direction as the magnetic field orientation of the reference layer. In some embodiments, the magnetic field orientation of the anti-pinning layer is a different direction from the magnetic field orientation of the reference layer. A further description of setting magnetic field orientation during a manufacturing process is provided below during discussion of the reference layer. Ferromagnetic materials used for an anti-pinning layer are similar to those used to make a reference layer and a free layer of the magnetic tunneling junction. Further description of ferromagnetic materials suitable for use as an anti-pinning layer, a reference layer, and a free layer in a magnetic tunneling junction is provided below during discussion of the reference layer.

In some embodiments, a spacer (not shown) is located between an anti-pinning layer and a reference layer. In some embodiments, a spacer in a magnetic tunneling junction stack includes a material such as silicon dioxide, hafnium oxide, or silicon nitride.

A reference layer is deposited as part of a magnetic tunneling junction stack. According to some embodiments, the reference layer is deposited by a sputtering process, a physical vapor deposition (PVD) deposition process, or some other process suitable for depositing a ferromagnetic material onto a substrate for subsequent patterning and etching. In some embodiments, the reference layer ferromagnetic material is a homogenous material deposited from a sputtering target having a similar composition. In some embodiments, the reference material ferromagnetic material is deposited from a plurality of sputtering targets and the layers of deposited material are mixed by an annealing process which rapidly heats and cools the material to mix the materials and produce a non-homogeneous distribution of ferromagnetic material in the reference layer film. The reference layer holds a fixed-orientation magnetic field imposed on the reference layer during an anneal process. The orientation of the reference layer magnetic field is set by an external magnetic field applied to the reference layer as the reference layer cools, during the anneal process, below the Curie temperature of the reference layer material. Ferromagnetic materials suitable for use as a reference layer, an anti-pinning layer, or a free layer of a magnetic tunneling junction include nickel (Ni), iron (Fe), cobalt (Co), boron (B), germanium (Ge), manganese (Mn), palladium (Pd), platinum (Pt), terbium (Tb), or alloys thereof, such as cobalt iron (CoFe), cobalt iron boride (CoFeB), gadolinium iron (GdFe), terbium iron cobalt (TbFeCo), gadolinium iron cobalt (GdFeCo), cobalt platinum (CoPt), cobalt palladium (CoPd), iron palladium (FePd), or iron platinum (FePt), although other ferromagnetic materials are also within the scope of the present disclosure.

In some embodiments, the reference layer is a single layer of ferromagnetic material. In some embodiments, the reference layer is a multi-layer reference layer, where the seed layer (not shown), an anti-pinning layer (not shown), and a spacer layer (not shown) separate the reference layer from a conductive line in an inter-layer dielectric material layer. Layers of ferromagnetic materials, whether pure metals or alloys, are deposited (by, e.g., sputtering) onto a surface.

In some embodiments, the anti-pinning layer is magnetized separately from the reference layer. In some embodiments, the reference layer and the anti-pinning layer have different Curie temperatures. In some embodiments, the anti-pinning layer and the reference layer are annealed in a single annealing process to set the magnetic field orientations of the films. In some embodiments, the anti-pinning layer is annealed in the presence of a first magnetic field having a first magnetic field orientation, and the reference layer is annealed in the presence of a second magnetic field having a second magnetic field orientation different from the first magnetic field orientation. In some embodiments, the first magnetic field orientation and the second magnetic field orientations are perpendicular orientations. In some embodiments, the ferromagnetic material having a higher Curie temperature is given a set magnetic field orientation before the antiferromagnetic material having a lower Curie temperature. A magnetic field orientation is set when a ferromagnetic material has been heated above the Curie temperature and, in the presence of an external magnetic field, cools to a temperature below the Curie temperature in the presence of the external magnetic field.

A layer of barrier material (a barrier layer) is between a reference layer and a free layer. A barrier material is a dielectric material deposited from, e.g., an atomic layer deposition (ALD) process, a chemical vapor deposition process, or some other method of depositing dielectric films on an integrated circuit substrate. Tunneling magnetoresistance of the junction increases with increasing order within the layer of barrier material. Barrier materials include aluminum oxides, both amorphous and crystalline, magnesium oxide (MgO), and hafnium oxide (HfO). In some embodiments, magnetic tunneling junctions are annealed following deposition of the barrier material in order to promote order within the barrier material, provided that the annealing process does not interfere with the set magnetic field orientations in the reference layer and/or the anti-pinning layer.

A free layer is deposited on top of the barrier layer in the magnetic tunneling junction stack. The free layer includes one or more layers of ferromagnetic materials configured to have changeable magnetic field orientations during operation of the integrated circuit. Ferromagnetic materials for free layers of magnetic tunneling junctions are deposited using, e.g., sputtering or PVD to deposit a thin layer of high-metal content material. In some embodiments, the free layer and the reference layer are a same ferromagnetic material from a same source. Ferromagnetic materials appropriate for use as a free layer resemble the ferromagnetic materials described hereinabove as suitable for use in a reference layer of the magnetic tunneling junction. In some embodiments, the free layer includes multiple films of ferromagnetic material separated by a coupling layer. In some embodiments, a coupling layer includes a peer metal such as ruthenium.

An anti-ferromagnetic layer is deposited on top of the free layer in the magnetic tunneling junction stack. According to some embodiments, the antiferromagnetic layer is deposited by a sputtering process, a physical vapor deposition (PVD) deposition process, or some other process suitable for depositing an antiferromagnetic material onto a substrate for subsequent patterning and etching. In some embodiments, the antiferromagnetic material is a homogenous material deposited from a sputtering target having a similar composition. In some embodiments, the antiferromagnetic material is deposited from a plurality of sputtering targets and the layers of deposited material are mixed by an annealing process which rapidly heats and cools the material to mix the materials and produce a non-homogeneous distribution of ferromagnetic material in the reference layer film.

An antiferromagnetic layer has a large spin orbit coupling strength. High spin orbit coupling strength serves to promote generation of a magnetic field by the electrical current flowing through the antiferromagnetic layer to reverse or modify the magnetic field orientation in the free layer of the magnetic tunneling junction stack. In some embodiments, anti-ferromagnetic layers include materials such as platinum (Pt), tantalum (Ta), tungsten (W), hafnium (Hf), iridium (Ir), osmium (Os), and manganese (Mn), or alloys thereof. In some embodiments, materials having large spin orbit coupling strength have high electrical resistivity, ranging from about 150 $\mu\Omega$cm to about 250 $\mu\Omega$cm. Electrical resistivity below 150 $\mu\Omega$cm does not consistently produce sufficient spin-orbit coupling to flip the magnetic field state of the free layer between states associated with information storage. Electrical resistivity above 250 $\mu\Omega$cm tends to produce a strong spin-orbit coupling effect, but is associated with larger amounts of heat production and power consumption, reducing the low-power consumption and speed benefits of magnetoresistive random access memory.

In an operation 404, a layer of patterning material is deposited over the layers of the magnetic tunneling junction stack and patterned prior to etching the magnetic tunneling junction stack to form isolated magnetic tunneling junctions. In some embodiments, patterning material is a layer of light-sensitive polymeric material. In some embodiments, the patterning material is an inorganic mask layer covered by a light-sensitive polymeric material, where a pattern added to the light-sensitive polymeric material is transferred to the inorganic mask layer by an etch process. In some embodiments, the patterning material is an electron-sensitive patterning material that responds to electron beams from a electron-beam patterning tool.

In an operation 406, isolated magnetic tunneling junctions are formed by etching the magnetic tunneling junction stack to define portions of the magnetic tunneling junction stack below features of the patterning material while exposing the base interlayer dielectric around isolated magnetic tunneling junctions, and exposing conductive lines and other interconnection metallization. In some embodiments, the etching process to form an isolated magnetic tunneling junction from a magnetic tunneling junction stack includes sequential etch steps in a single etch chamber to reduce manufacturing time for the integrated circuit. In some embodiments, etching to form an isolated magnetic tunneling junction includes multiple etch processes in multiple etch chambers, the chambers being attuned to produce a sidewall profile and dimensions of the isolated magnetic tunneling junction which meet a circuit specification for the integrated circuit. According to some embodiments, metallic layers including the anti-pinning layer, reference layer, free layer (or, free layer films), and antiferromagnetic layers are etched in a low-pressure plasma environment using halogen molecules or halogenated etchants. In some embodiments, the metallic layers are etched by a liquid-phase containing etchants configured to dissolve, with low residence time and high anisotropy, materials from the surface of the integrated circuit. Liquid-phase etching of antiferromagnetic and ferromagnetic materials includes the use of strong acids including one or more of sulfuric, nitric, and phosphoric acids, alone or in combination.

In an operation 408, at least one layer of a spacer dielectric material is deposited over the isolated magnetic tunneling junctions and the base ILD. Spacer dielectric materials include, among others, silicon nitride, silicon oxy-nitride, and silicon dioxide dielectric materials deposited onto an integrated circuit substrate. In some embodiments, the spacer dielectric materials are deposited by chemical vapor deposition, or atomic layer deposition, to modulate the density and dielectric constant of the film. In some embodiments, film density is increased to preserve a bottom-most layer of the spacer dielectric material with a high resistance to etching during formation of vias through an inter-layer dielectric material.

In an operation 410, a portion of the at least one layer of spacer dielectric material is removed from a top surface of the isolated magnetic tunneling junctions. In some embodiments, a thin remaining layer of spacer dielectric material remains on the top surface of the isolated magnetic tunneling junctions to act as an etch stop layer during formation of vias to connect to exposed conductive lines in the base ILD or to the antiferromagnetic layer. According to some embodiments, an anisotropic plasma etch process is used to remove the spacer dielectric material on flat surfaces at a higher rate than the rate of removal of the spacer dielectric material from sidewalls of the isolated magnetic tunneling junctions. An anisotropic etching process leaves a ring of spacer dielectric material against the sidewalls of the isolated magnetic tunneling junctions while thinning the spacer dielectric on a top surface of the isolated magnetic tunneling junction or on a flat surface surrounding the isolated magnetic tunneling junction (open areas).

In an operation 412, an interlayer dielectric material is deposited over isolated magnetic tunneling junctions and, when present, any remaining spacer dielectric material on the top surface of the base ILD. ILD deposition occurs by chemical vapor deposition to form a layer of insulating material over the spacer dielectric material. Atomic layer deposition (ALD) is not used for ILD deposition because the deposition rate of ALD is quite slow relative to the rates of different forms of chemical vapor deposition. The interlayer dielectric material deposited over the magnetic tunneling junctions has a thickness appropriate for forming vias with two different depths. Vias having a first depth extend from a top surface of the interlayer dielectric material to conductive lines in the base ILD. Vias having a second depth extend from top surface of the interlayer dielectric material to a top surface of the antiferromagnetic material on top of the magnetic tunneling junctions.

In an operation 414, a plurality of the openings are formed in the interlayer dielectric material. In some embodiments of method 400, the remaining portion of spacer dielectric material protects the antiferromagnetic material from damage during the process of etching the plurality of openings for the vias. In some embodiments, all of the plurality of openings are formed in a single etching process. In some embodiments, the plurality of openings includes openings formed using different etching processes. A single etching process reduces the total number of patterning masks used to generate the integrated circuit and helps to reduce production costs. Multiple etching processes provides better control over the shape and depth of the openings.

In an operation 416, the openings are filled with a conductive material to make electrical connections with the anti-ferromagnetic material on top of the magnetic tunneling junctions and conductive lines in the base ILD which are exposed at the bottom of corresponding openings through the interlayer dielectric material that covers the magnetic tunneling junctions. In some embodiments, the operations described in method 400 are performed in an order different than the order recited herein. For example, in some embodiments, the order of performing etching processes to form via openings entrench openings are reversed from the order described herein. In some embodiments, some operations are omitted. In some embodiments, some operations not described herein are added in order to facilitate production of the integrated circuit.

Figure 5B:
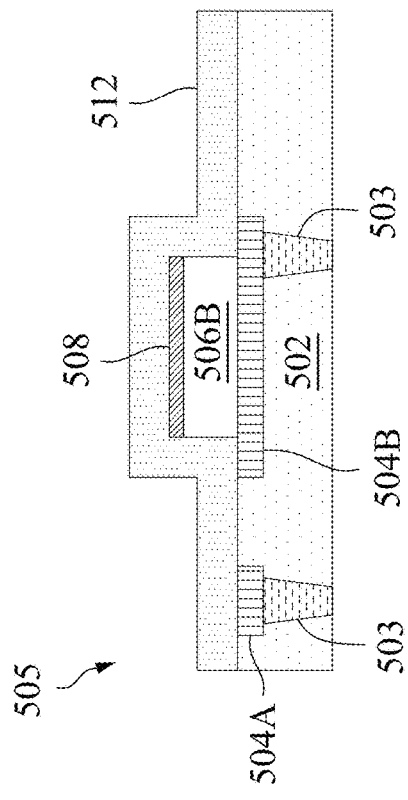
FIGS. 5A-5H are cross-sectional diagrams of an integrated circuit during various stages of a manufacturing process, according to some embodiments.
Figure 5D:
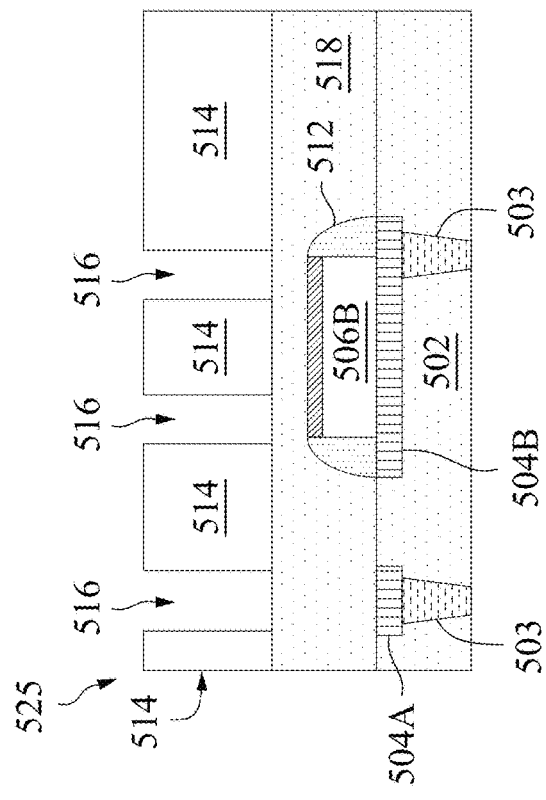
Figure 5A:
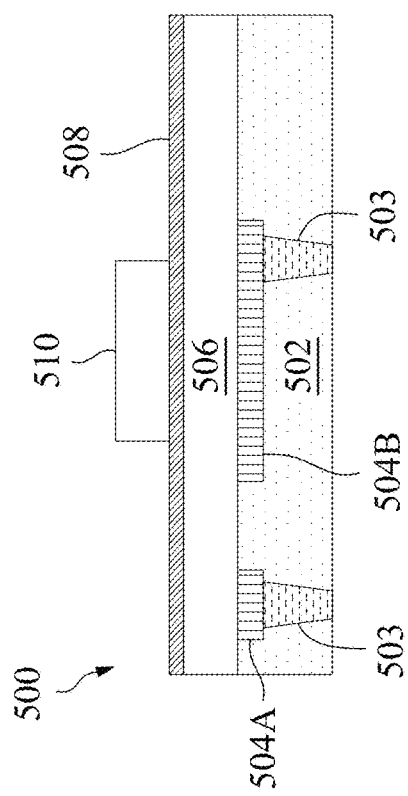

FIGS. 5A-5H are cross-sectional diagrams of an integrated circuit during a manufacturing process, according to some embodiments. FIG. 5A is a cross-sectional diagram of an integrated circuit 500, according to some embodiments. In integrated circuit 500, a base interlayer dielectric material 502 includes a plurality of conductive lines 504A, 504B. A plurality of films comprising a magnetic tunneling junction stack 506 is deposited on top of base ILD 502 and conductive lines 504A-B. Conductive line 504B is an electrode for a magnetic tunneling junction. A plurality of vias 503 in base ILD 502 connect to each of conductive lines 504A and 504B to supply a conductive path for the write current and read current for the MRAM cell. A layer of antiferromagnetic material 508 is above magnetic tunneling junction stack 506. A patterned portion of patterning material 510 is over antiferromagnetic material 508, and over conductive line 504B. The location of patterned portion of patterning material 510 corresponds to a location of an isolated magnetic tunneling junction to be formed by an etch process.

FIG. 5B is a cross-sectional diagram of an integrated circuit 505 during a manufacturing process, according to some embodiments. In FIG. 5B, an isolated magnetic tunneling junction 506B remains over conductive lines 504B, while the magnetic tunneling junction stack has been removed from most of the top surface of base ILD 502 and from over conductive line 504B. In integrated circuit 505, at least one layer of spacer dielectric material 512 has been deposited on top of conductive lines 504A, base ILD 502, antiferromagnetic material 508, and over the top and sides of isolated magnetic tunneling junction 506B. According to some embodiments, the at least one layer of spacer dielectric material includes silicon nitride, silicon oxide nitride, and or silicon dioxide. In some embodiments, a thin layer of a first spacer dielectric material (not shown) is grown over the top surface of conductive line 504B, base ILD 502, the sides of isolated magnetic tunneling junction 506B, and over the sides and top of antiferromagnetic material 508 using, e.g., atomic layer deposition for chemical vapor deposition. According to some embodiments, a second spacer dielectric material is grown or deposited on top of the first spacer dielectric material. In some embodiments of method 400, the first spacer dielectric material serves a dual function, as part of a spacer against sides of the magnetic tunneling junction and the antiferromagnetic material, and as an etch stop layer on top of antiferromagnetic material 508 and a top surface of conductive line 504A.

Figure 5C:
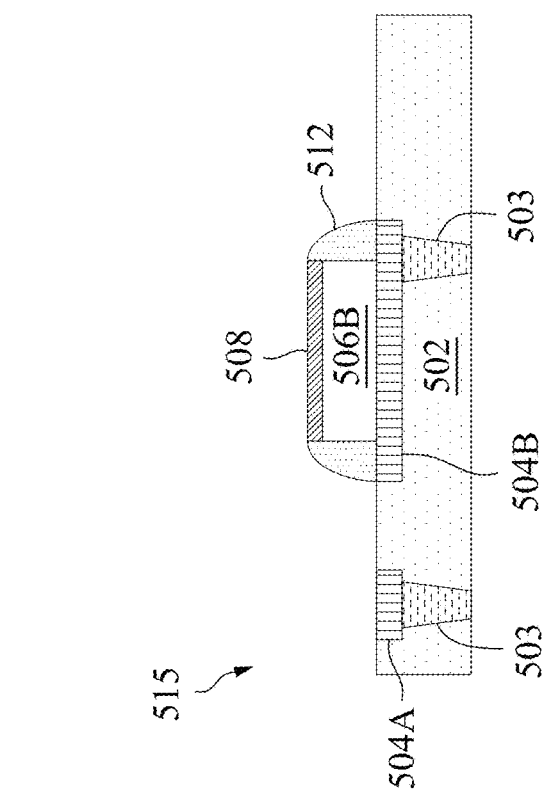

FIG. 5C is a cross-sectional diagram of an integrated circuit 515 during a manufacturing process, according to some embodiments. In FIG. 5C, an etch process has been performed to remove spacer dielectric material. In some embodiments, a remaining portion of spacer dielectric material, or, as described above in FIG. 5B, the first spacer dielectric material (not shown) remains on a top surface of antiferromagnetic material 508 and on top of conductive line 504A. Spacer 512 is against the sidewalls individual layers in isolated magnetic tunneling junction 506B and against the sidewall of antiferromagnetic material 508. Spacer 512 is also against a top surface of conductive line 504B (a read electrode for the magnetic tunneling junction).

FIG. 5D is a cross-sectional diagram of an integrated circuit 525 during a manufacturing process, according to some embodiments. In FIG. 5D, a second interlayer dielectric material 518 has been deposited over base ILD 502, conductive line 504B, spacer 512, and magnetic tunneling junction 506B. Further, in integrated circuit 525, a second layer of patterning material 514 has been deposited on top of second ILD 518 and patterned to have a plurality of openings 516 corresponding to locations of vias to extend through second ILD 518.

Figure 5E:
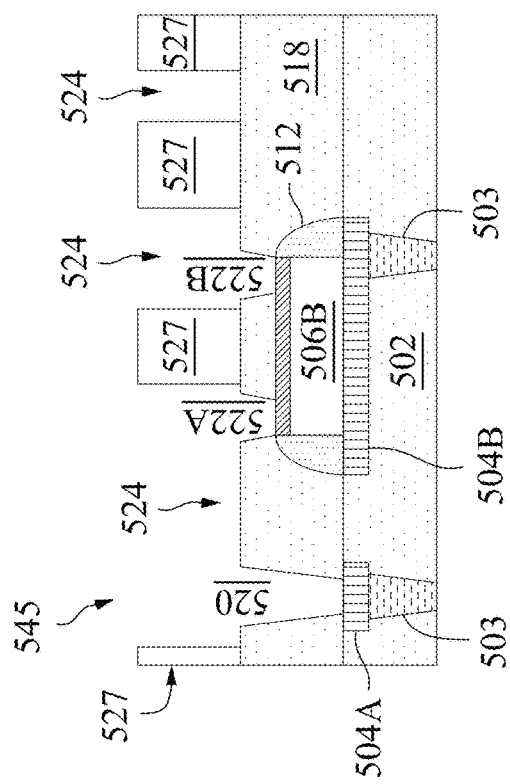

FIG. 5E is a cross-sectional diagram of an integrated circuit 535 during a manufacturing process, according to some embodiments. In integrated circuit 535, the plurality of patterning material openings 516 remain in patterning material 514, and via openings 520 and 522A-522B are formed in ILD 518. Integrated circuit 535 includes two types of the openings in ILD 518. Via opening 520 extends from a top surface of ILD 518 toward conductive line 504A. Via openings 522A-522B extend from a top surface of ILD 518 toward antiferromagnetic layer 508 over isolated magnetic tunneling junction 506B. According to some embodiments, a portion of spacer dielectric material remains at the bottom of the opening 520 and the openings 522A-522B to protect conductive line 504A and antiferromagnetic layer 508 from damage during an etch process, and to protect a remainder of the integrated circuit from metal contamination from the antiferromagnetic layer 508.

Figure 5F:
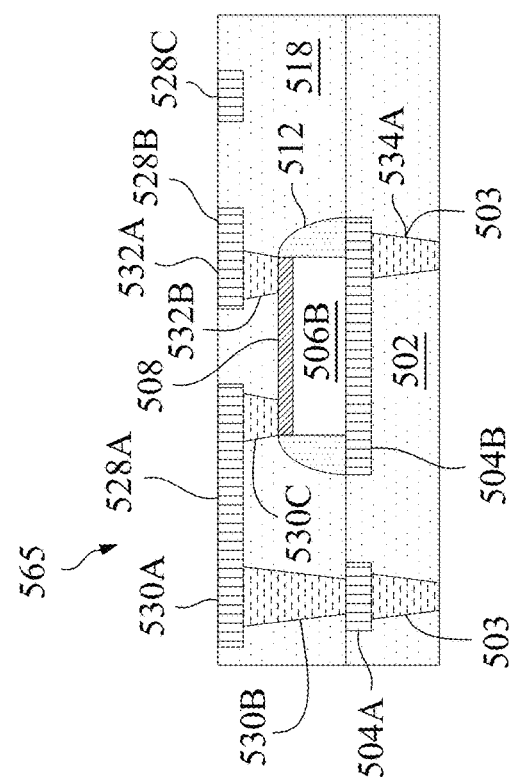

FIG. 5F is a cross-sectional diagram of an integrated circuit 545 during a manufacturing process, according to some embodiments. In integrated circuit 545, a third layer of patterning material has been deposited and patterned to produce a plurality of openings 524 corresponding to locations of trenches or conductive lines to be formed in interlayer dielectric 518. According to some embodiments, a portion of spacer dielectric material remains at the bottom of the via openings to protect conductive lines 504A and antiferromagnetic material 508 during a trench etch or conductive line etch process.

Figure 5G:
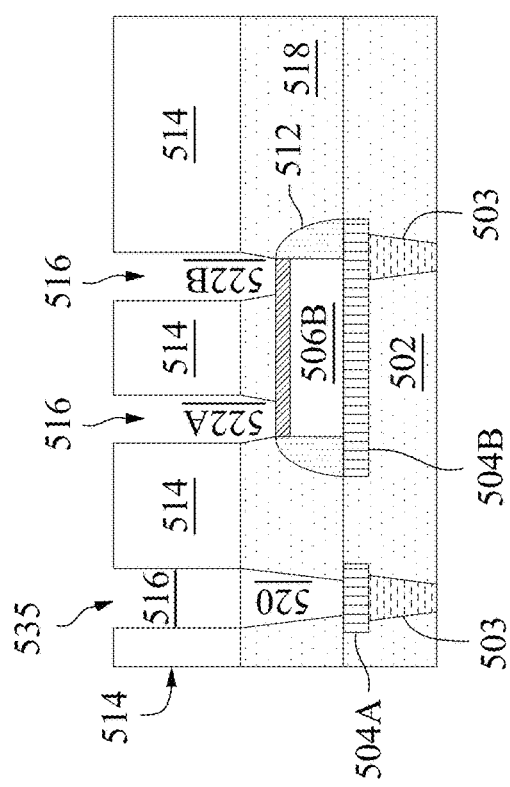

FIG. 5G is a cross-sectional diagram of an integrated circuit 555 during a manufacturing process, according to some embodiments. In integrated circuit 555, patterning material has been removed from the surface of ILD 518, leaving a plurality of the openings including via opening 520 and via openings 522A-522B, and trench openings 5268A, 526B, and 526C. Trench opening 526A corresponds to an island, joining via opening 520 and via opening 522A. Trench opening 526B joins with via opening 522B. Trench opening 526C does not visibly connect to a via opening in interlayer dielectric 518. In some embodiments of a manufacturing process, at the conclusion of a trench etch process to form trench openings such as trench openings 526A, 526B, and 526C, an etch step is performed to remove residual or remaining etch stop material (and/or, spacer dielectric material) exposed at the bottom of via openings present in interlayer dielectric 518.

Figure 5H:
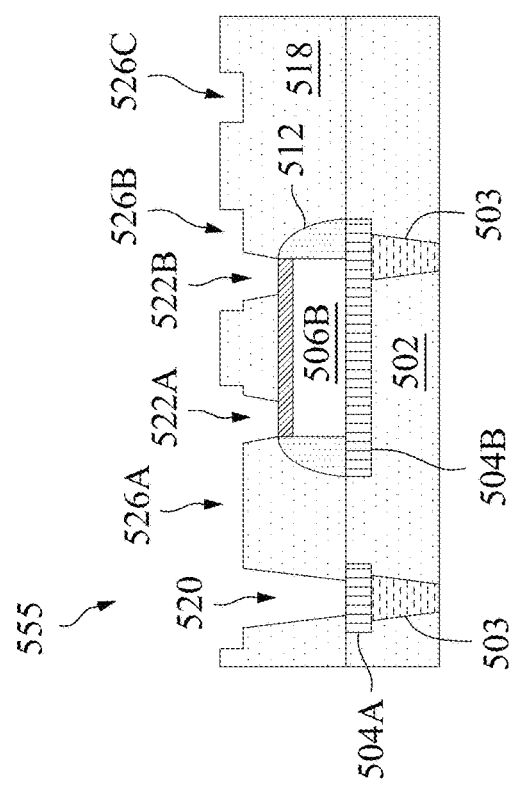

FIG. 5H is a cross-sectional diagram of an integrated circuit 565, during a manufacturing process, according to some embodiments. In integrated circuit 565, a conductive material has been deposited into the via and trench openings to form another layer of an interconnection structure of integrated circuit 565. A tall via 530B corresponds to conductive material filled into via opening 520, a short via 530C corresponds to conductive material filled into via opening 522A, and a short via 532B corresponds to conductive material filled into via opening 522B. A conductive bar 528A corresponds to conductive material filled into trench opening 526A, wherein the conductive bar 528A electrically connects tall via 530B and short via 530C. Conductive bar 532A corresponds to conductive material filled into trench opening 526B and electrically connected to short via 532B. Conductive bar 528C corresponds to conductive material deposited into trench opening 526C. Conductive bar 528A is a write electrode 530A, and conductive bar 528B is a dual function electrode 532A. Conductive bar 528B (or, the dual function electrode 532A) is a used for writing the contents of the magnetic tunneling junction 506B. During a write process, a write current flows from conductive bar 528A, through short via 530C, through antiferromagnetic layer 508, through short via 532B, and through conductive bar 528B. During a write process, the current flowing through antiferromagnetic layer 508 triggers spin orbit transfer within the free layer, realigning the magnetic field the free layer of magnetic tunneling junction 506B to a new magnetic field orientation.

As described previously in FIG. 2 and FIG. 3A, a read current is directed through magnetic tunneling junction 506B from conductive line 504B (a read electrode) to the dual function electrode 532A by tunneling current passing through the magnetic tunneling junction 506B and the via 532B. In the present disclosure, conductive bars (e.g., filled trenches) are treated as electrodes for the magnetic tunneling junction. However, according to some embodiments, the vias, such as via 530C, 532B, and via 534A (see FIG. 5H) are considered electrodes for directing current into and out of a magnetic tunneling junction because these vias are directly in contact with the magnetic tunneling junction 506B.

Aspects of the present disclosure relate to an integrated circuit, including a magnetoresistive random access memory cell comprising a bar-type magnetic tunnel junction, having a reference layer including a first magnetizable material, a free layer including a second magnetizable material, and a barrier layer between the reference layer and the free layer; an antiferromagnetic layer over the free layer; and a spacer contacting a sidewall of the reference layer and a sidewall of the antiferromagnetic layer. In some embodiments of the integrated circuit, the bar-type magnetic tunnel junction has a first dimension in a first direction, and a second dimension in the second direction, wherein the first dimension is smaller than the second dimension. In some embodiments of the integrated circuit, sidewalls of the reference layer, the barrier layer, and the free layer are substantially aligned. In some embodiments of the integrated circuit, the antiferromagnetic layer comprises iridium or manganese. In some embodiments, the integrated circuit further comprises a first via connected to the antiferromagnetic layer; and a second via connected to the antiferromagnetic layer. In some embodiments the integrated circuit further includes a conductive line directly connected to the magnetic tunneling junction. In some embodiments, the conductive line extends beyond the sidewall of the reference layer in a direction parallel to a top surface of the reference layer. In some embodiments, the first magnetizable material is different from the second magnetizable material. In some embodiments, the free layer includes a first ferromagnetic film adjacent to the barrier layer, a second ferromagnetic film, and a coupling layer between the first ferromagnetic film and the second ferromagnetic film.

Aspects of the present disclosure relate to a method of making an integrated circuit, including depositing a first ferromagnetic material over a substrate; applying a first magnetic field to the first ferromagnetic material; annealing the first ferromagnetic material while applying the first magnetic field to the first ferromagnetic material to set a magnetic field orientation in the first ferromagnetic material; depositing barrier material over the first ferromagnetic material; depositing a second ferromagnetic material over the barrier material; depositing an antiferromagnetic material over the second ferromagnetic material; and etching the first ferromagnetic material, the barrier material, the second ferromagnetic material to define a magnetic tunneling junction, and the antiferromagnetic material, wherein the etching comprises defining a sidewall of the antiferromagnetic material aligned with a sidewall of the first ferromagnetic material. In some embodiments of the method, annealing the first ferromagnetic material includes heating the first ferromagnetic material to a first temperature above a Curie temperature of the first ferromagnetic material; and cooling the first ferromagnetic material to a second temperature below the Curie temperature of the first ferromagnetic material. In some embodiments, the method includes depositing a dielectric material over a top surface and sides of the magnetic tunneling junction; and thinning the dielectric material over the magnetic tunneling junction. In some embodiments of the method, thinning the dielectric includes forming a spacer at the sides of the magnetic tunneling junction. In some embodiments, thinning the dielectric material includes maintaining a portion of the dielectric material on a top surface of the magnetic tunneling junction. In some embodiments, the method includes depositing an interlayer dielectric (ILD) material over the top surface of the dielectric material; and patterning the ILD material to define a first via opening and a second via opening, wherein both the first via opening and the second via opening expose the antiferromagnetic material. In some embodiments, the method includes filling the first via opening and the second via opening with a conductive material.

Aspects of the present disclosure relate to an integrated circuit which includes a magnetic tunneling junction, having a reference layer, a free layer, and a barrier layer between the reference layer and the free layer, wherein an interface between the barrier layer and the free layer has a first area; and an antiferromagnetic layer over the reference layer, wherein an interface of the antiferromagnetic layer and the reference layer has a second area equal to the first area, wherein a first magnetic tunneling junction sidewall (MTJ sidewall) extends along a first antiferromagnetic layer sidewall (AFL sidewall) for at least half of a length of the magnetic tunneling junction. In some embodiments, the integrated circuit includes a dielectric material against a sidewall of the magnetic tunneling junction reference layer, free layer, barrier layer, and the antiferromagnetic layer. In some embodiments, the integrated circuit includes a first via connected to the antiferromagnetic layer; and a second via connected to the antiferromagnetic layer. In some embodiments, the integrated circuit includes a conductive line in direct contact with the magnetic tunneling junction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
 a magnetoresistive random access memory cell comprising:
  a bar-type magnetic tunnel junction, having
   a reference layer including a first magnetizable material,
   a free layer including a second magnetizable material, wherein a width of the free layer in a first direction is a first width, and
   a barrier layer between the reference layer and the free layer;
  an antiferromagnetic layer over the free layer, wherein a width of the antiferromagnetic layer in the first direction is the first width; and
  a spacer directly contacting a sidewall of the reference layer and directly contacting the sidewall of the antiferromagnetic layer;
 a dielectric layer directly contacting a sidewall and a top-most surface of the spacer;
 a first conductive element in direct electrical connection with the antiferromagnetic layer at a first location on the antiferromagnetic layer; and
 a second conductive element in direct electrical connection with the antiferromagnetic layer at a second location on the antiferromagnetic layer, wherein the first location is separated from the second location in the first direction, and the first direction is parallel to a top surface of the antiferromagnetic layer.

2. The semiconductor device of claim 1, wherein the bar-type magnetic tunnel junction has a first dimension in a first direction, and a second dimension in the second direction, wherein the first dimension is smaller than the second dimension.

3. The semiconductor device of claim 1, wherein sidewalls of the reference layer, the barrier layer, and the free layer are substantially aligned.

4. The semiconductor device of claim 1, wherein the antiferromagnetic layer comprises iridium or manganese.

5. The semiconductor device of claim 1, further comprising:
 a first via connected to the antiferromagnetic layer; and
 a second via connected to the antiferromagnetic layer.

6. The semiconductor device of claim 1, further comprising a conductive line directly connected to the magnetic tunneling junction.

7. The semiconductor device of claim 6, wherein the conductive line extends beyond the sidewall of the reference layer in a direction parallel to a top surface of the reference layer.

8. The semiconductor device of claim 1, wherein the first magnetizable material is different from the second magnetizable material.

9. The semiconductor device of claim 1, wherein the free layer comprises:
 a first ferromagnetic film adjacent to the barrier layer,
 a second ferromagnetic film, and
 a coupling layer between the first ferromagnetic film and the second ferromagnetic film.

10. An integrated circuit, comprising:
 a magnetic tunneling junction, having a reference layer, a free layer, and a barrier layer between the reference layer and the free layer, wherein an interface between the barrier layer and the free layer has a first area;
 an antiferromagnetic layer over the free layer, wherein an interface of the antiferromagnetic layer and the free layer has a second area equal to the first area, wherein the free layer has a first layer sidewall extending along a first antiferromagnetic layer sidewall (AFL sidewall) for at least half of a length of the magnetic tunneling junction;
 an interconnect structure, wherein the interconnect structure comprises:
  a first via in direct contact with the antiferromagnetic layer, wherein the first via extends beyond the antiferromagnetic layer in a direction, and the direction parallel to the interface of the antiferromagnetic layer and the free layer; and
  a second via in direct contact with the antiferromagnetic layer, wherein first via is electrically connected to the second via through the antiferromagnetic layer.

11. The integrated circuit of claim 10, further comprising a dielectric material against a sidewall of the magnetic tunneling junction reference layer, free layer, barrier layer, and the antiferromagnetic layer.

12. The integrated circuit of claim 11, wherein the first via directly contacts the dielectric layer.

13. The integrated circuit of claim 10, further comprising a conductive line in direct contact with the magnetic tunneling junction.

14. A semiconductor device, comprising:
a bar-type magnetic tunneling junction (MTJ), wherein a major axis of the bar-type MTJ extends along a first direction, and the bar-type MTJ comprises:
a reference layer,
a free layer, wherein the free layer has a first width in a first direction, and
a barrier layer between the reference layer and the free layer, wherein an interface between the barrier layer and the free layer has a first area;
an antiferromagnetic layer over the free layer, wherein a sidewall of the antiferromagnetic layer is aligned with a sidewall of the bare-type MTJ in the first direction, and the antiferromagnetic layer has the first width in the first direction;
a first contact electrically connected to a first end of the antiferromagnetic layer;
a second contact electrically connected to a second end of the antiferromagnetic layer, opposite the first end, where the first contact is electrically connected to the second contact through the antiferromagnetic layer, and the second contact is separated from the first contact in the first direction;
a spacer surrounding the antiferromagnetic layer and surrounding the bar-type MTJ; and
a dielectric layer surrounding the spacer, wherein the dielectric layer directly contacts the spacer, and the dielectric layer directly contacts multiple sidewalls of the first contact.

15. The semiconductor device of claim 14, wherein the first contact directly contacts the spacer.

16. The semiconductor device of claim 14, wherein the spacer is in direct contact with an entirety of the sidewall of the antiferromagnetic layer.

17. The semiconductor device of claim 14, wherein the antiferromagnetic layer is electrically connected to a read line of the semiconductor device.

18. The semiconductor device of claim 14, wherein the antiferromagnetic layer is electrically connected to a write line of the semiconductor device.

19. The semiconductor device of claim 14, wherein reference layer and the free layer comprise different ferromagnetic materials.

20. The semiconductor device of claim 14, wherein the antiferromagnetic layer comprises iridium or manganese.

* * * * *